United States Patent
Shiraishi

(10) Patent No.: US 9,461,672 B2
(45) Date of Patent: Oct. 4, 2016

(54) SIGNAL QUALITY EVALUATION APPARATUS, SIGNAL QUALITY EVALUATION METHOD, AND REPRODUCING DEVICE

(71) Applicant: Sony Corporation, Tokyo (JP)

(72) Inventor: Junya Shiraishi, Nagano (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 14/403,482

(22) PCT Filed: Apr. 26, 2013

(86) PCT No.: PCT/JP2013/062487
§ 371 (c)(1),
(2) Date: Nov. 24, 2014

(87) PCT Pub. No.: WO2013/183385
PCT Pub. Date: Dec. 12, 2013

(65) Prior Publication Data
US 2015/0143208 A1    May 21, 2015

(30) Foreign Application Priority Data
Jun. 4, 2012 (JP) ................. 2012-126966

(51) Int. Cl.
*H04L 1/00* (2006.01)
*H03M 13/45* (2006.01)
(Continued)

(52) U.S. Cl.
CPC ...... *H03M 13/456* (2013.01); *G11B 20/10268* (2013.01); *G11B 20/10277* (2013.01);
(Continued)

(58) Field of Classification Search
CPC .................................................. H04L 1/0009

USPC ........................ 714/774, 794, 795
See application file for complete search history.

(56) References Cited

U.S. PATENT DOCUMENTS

2005/0024931 A1   2/2005  Cowles
2005/0213481 A1*  9/2005  Ando ................ G11B 7/00458
                                                369/275.3
(Continued)

FOREIGN PATENT DOCUMENTS

CN        1694169 A       11/2005
CN        1917074 A        2/2007
(Continued)

OTHER PUBLICATIONS

International Search Report issue in connection with International Patent Application No. PCT/JP2013/062487, dated May 28, 2013. (1 page).
(Continued)

*Primary Examiner* — Fritz Alphonse
(74) *Attorney, Agent, or Firm* — K&L Gates LLP

(57) ABSTRACT

Provided is a signal quality evaluation apparatus, including an error pattern detection unit to which binarized data obtained by performing a PRML decoding process on a reproduced signal of bit information by partial response equalization and maximum likelihood decoding is input, the error pattern detection unit configured to detect at least one specific error pattern that is a bit pattern that is longer than a constraint length of the PRML decoding process, a metric difference calculation unit configured to calculate a metric difference of the at least one specific error pattern that has been detected by the error pattern detection unit, and an index value generation unit configured to generate an index value of a reproduced signal quality by using a distribution of the metric difference obtained by the metric difference calculation unit.

13 Claims, 11 Drawing Sheets

(51) Int. Cl.
*H03M 13/00* (2006.01)
*G11B 20/10* (2006.01)
*G11B 20/18* (2006.01)
*H03M 13/41* (2006.01)

(52) U.S. Cl.
CPC ... *G11B20/10305* (2013.01); *G11B 20/10361* (2013.01); *G11B 20/10379* (2013.01); *G11B 20/1833* (2013.01); *H03M 13/6343* (2013.01); *H03M 13/41* (2013.01)

(56) References Cited

U.S. PATENT DOCUMENTS

| | | | |
|---|---|---|---|
| 2007/0014385 A1 | 1/2007 | Shiraishi | |
| 2007/0234188 A1* | 10/2007 | Shiraishi | G11B 20/10009 714/794 |
| 2010/0002556 A1 | 1/2010 | Miyashita et al. | |
| 2010/0039912 A1* | 2/2010 | Nakano | G11B 20/10009 369/53.11 |
| 2010/0195462 A1 | 8/2010 | Minemura et al. | |

FOREIGN PATENT DOCUMENTS

| | | |
|---|---|---|
| JP | 3711140 | 10/2005 |
| JP | 3857685 | 12/2006 |
| JP | 2008-293577 | 12/2008 |
| JP | 4750488 | 8/2011 |
| WO | 2009/041598 | 4/2009 |
| WO | 2010/001588 | 1/2010 |
| WO | 2010/090136 | 8/2010 |

OTHER PUBLICATIONS

Extended European Search Report received in EP 13799823.3, May 17, 2016, 7 pages.

Chinese Office Action (with English translation) issued on Jun. 23, 2016 in corresponding Chinese application No. 201380028675.0 (16 pages).

* cited by examiner

FIG. 2
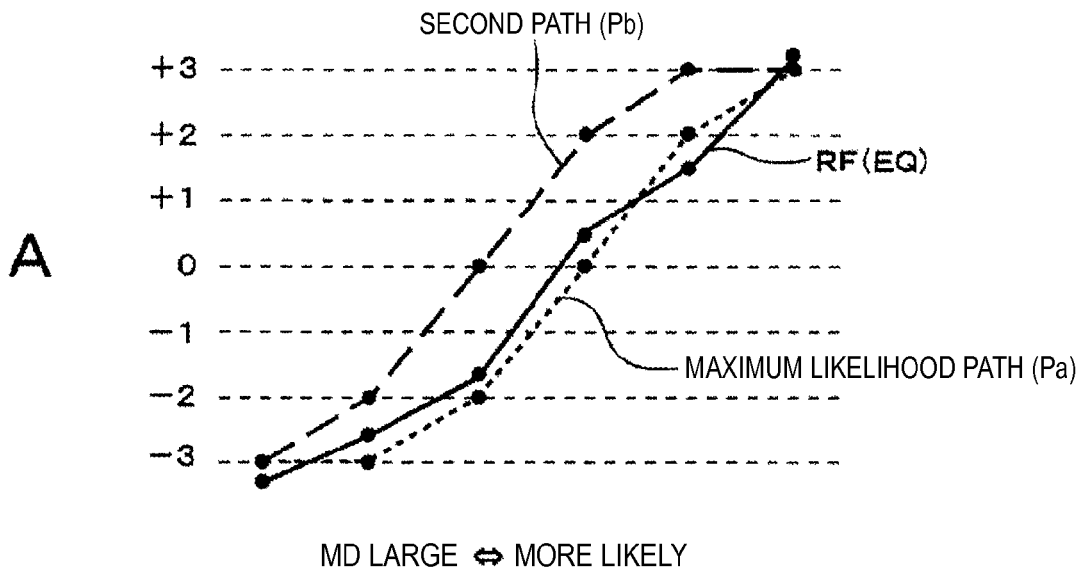
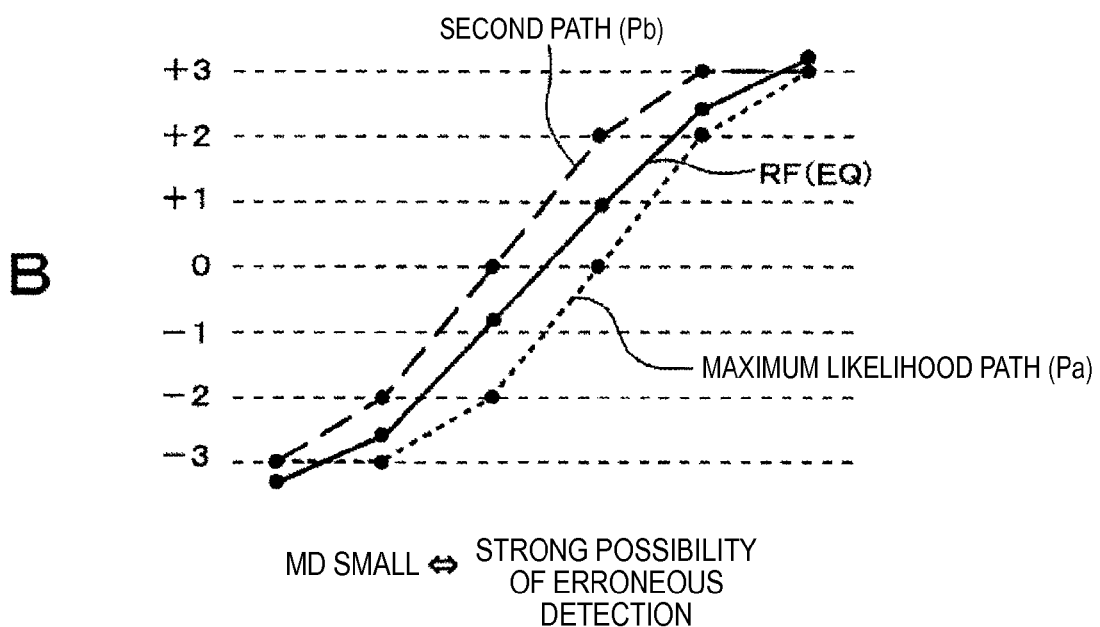

FIG. 4
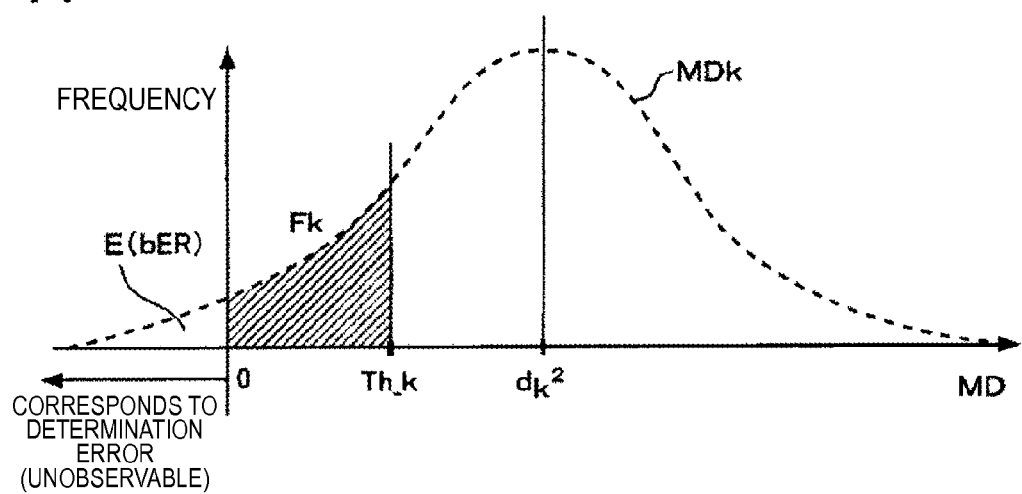
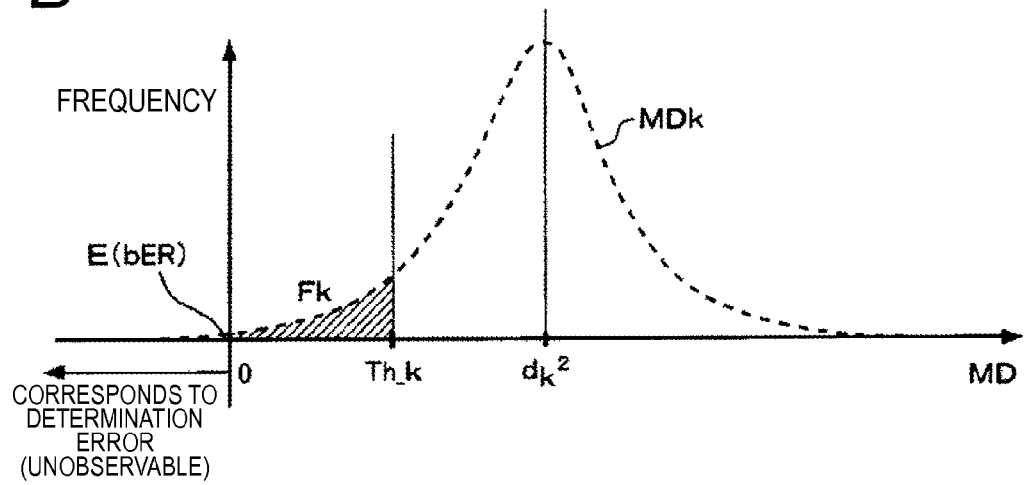

FIG. 11

PATTERN PTd1 (EDGE SHIFT)

| CORRECT PATTERN | 1 | 0 | 0 |
|---|---|---|---|
| INCORRECT PATTERN | 1 | 1 | 0 |
| BIT ERROR | 0 | 1 | 0 |

PATTERN PTd2 (CONSECUTIVE 2T SHIFTS)

| CORRECT PATTERN | 1 | 0 | 0 | 1 | 1 | 0 | 0 |
|---|---|---|---|---|---|---|---|
| INCORRECT PATTERN | 1 | 1 | 0 | 0 | 1 | 1 | 0 |
| BIT ERROR | 0 | 1 | 0 | 1 | 0 | 1 | 0 |

SIGNAL QUALITY EVALUATION APPARATUS, SIGNAL QUALITY EVALUATION METHOD, AND REPRODUCING DEVICE

CROSS REFERENCES TO RELATED APPLICATIONS

The present application is a national stage of International Application No. PCT/JP2013/062487 filed on Apr. 26, 2013 and claims priority to Japanese Patent Application No. 2012-126966 filed on Jun. 4, 2012, the disclosure of which is incorporated herein by reference.

BACKGROUND

The present disclosure relates to a signal quality evaluation apparatus and a signal quality evaluation method that are suitable for performing a decoding process using partial response maximum likelihood (PRML) on a reproduced signal from a recording medium, for example, and relates to a reproducing device that is provided with the signal quality evaluation apparatus and that performs reproduction of information.

For example, regarding an optical disk serving as an example of the recording medium, compact discs (CDs), digital versatile discs (DVDs), and Blu-ray Discs (BDs (registered trademark)) are widely used setting forth the history of high densification of recording.

In particular, in the case of high density recording at the level of a BD, a method using a technique called a partial response maximum likelihood (PRML) detection is typically used as a bit detection method.

PRML is a technology that combines a process of partial response and a technology of maximum likelihood detection. Partial response refers to a process of returning an output longer than one bit in response to a one-bit input, that is, a process of making a determination by a plurality of input bits of the output. In particular, a process of obtaining a reproduced signal as a signal obtained by multiplying an input of four consecutive information bits by 1, 2, 2, and 1 in this order and adding the results, as often used for optical disks such as the Blu-ray Disc and the like, is expressed as PR(1, 2, 2, 1).

Maximum likelihood detection is a method of defining a distance referred to as a path metric between two signal strings, determining a distance between an actual signal and a signal predicted from an assumed bit sequence, and detecting a bit sequence providing the closest distance. Incidentally, the path metric is defined as a distance obtained by adding the squares of differences in amplitude between two signals at same times over a whole time. Viterbi detection is used to search for the bit sequence providing the closest distance.

Partial response maximum likelihood combining these methods is a method of adjusting a signal obtained from bit information on a recording medium such that the signal is in a partial response process by a filter referred to as an equalizer, determining a path metric between the resulting reproduced signal and the partial response of an assumed bit sequence, and detecting a bit sequence providing the closest distance.

Based on the principle of PRML detection, a method using a metric difference (also referred to as a SAM value) distribution that indicates the margin of a Viterbi detector for selecting a path is already typically used as a method for evaluating the reproduced signal quality of an optical disk.

For example, a signal quality evaluation method has been disclosed in each of the Patent Literatures 1, 2, 3, and 4 described above that has a satisfactory correlation with error rates of PRML even when high-density recording is performed on a conventional optical disk.

In each of the methods, in a PRML class that is actually used, an index value is formed by extracting several error patterns that statistically have high frequency of error occurrence, by obtaining an index value of each of the error patterns, and by integrating the obtained index values together.

Since the error patterns each have a different metric difference distribution (a mean value of the distribution and a variance), the error patterns cannot be dealt as a single distribution and, thus, the above is performed.

CITATION LIST

Patent Literature

Patent Literature1: JP 3857685B
Patent Literature2: JP 3711140B
Patent Literature3: JP 4750488B
Patent Literature4: WO 10/001588

SUMMARY

Technical Problem

Meanwhile, performing ultra-high density recording that exceeds 40 GB that is BD equivalent on each layer of the recording layers, for example, are being considered by further increasing the density in the linear direction of conventional optical disks. In such a case, a significant degradation in the frequency characteristic of the channel, especially in the high-frequency components, occurs and intersymbol interference of the reproduced signals becomes even more stronger; accordingly, sufficient reproduction performance cannot be obtained without newly introducing a PRML class that has a longer constraint length and that is in conformity with the frequency characteristic of the channel. In the above case, upon change of the frequency characteristic of the reproduction channel and the PRML class, dominant error patterns also change together with the existing conditions.

Specifically, due to a high-frequency cutoff of the optical modulation transfer function (MTF), the amplitude of a short mark reproduced signal becomes extremely low such that not only the amplitude of the reproduced signal with the shortest mark, but also the amplitude of the reproduced signal with the second shortest mark can be hardly obtained.

Accordingly, a state has been reached in which the existing signal quality evaluation methods cannot be said to be suitable.

Hitherto, error patterns of the maximum likelihood decoding using PRML could be understood in units of bit or merely by a one-bit shift of the shortest mark. In other words, merely considering the above error patterns had been enough to express the signal quality.

However, under an ultra-high density recording condition that exceeds 40 GB that is BD equivalent, due to the above-described state, a number of new blockwise errors that include reversal of polarity of the recording mark and space have occurred in the error patterns of the maximum likelihood decoding using PRML. Moreover, among the entire error rates, contribution of the above error patterns is becoming dominant. Since the blockwise error patterns have error propagation characteristics, in some cases, an error extending across an extremely long section of 10 clock sections or more occurs.

Accordingly, even if an evaluation value is generated by detecting error patterns such as the one-bit shift and the like of the shortest mark, for example, it is difficult to say that the evaluation value reflects the actual error rate.

Therefore, an object of the present disclosure is to, even if high density recording further progresses, provide a signal evaluation method that can have a strong correlation with the error rate, that is, that can have high accuracy.

Solution to Problem

A signal quality evaluation apparatus according to the present disclosure includes an error pattern detection unit to which binarized data obtained by performing a PRML decoding process on a reproduced signal of bit information by partial response equalization and maximum likelihood decoding is input, the error pattern detection unit configured to detect at least one specific error pattern that is a bit pattern that is longer than a constraint length of the PRML decoding process, a metric difference calculation unit configured to calculate a metric difference of the at least one specific error pattern that has been detected by the error pattern detection unit, and an index value generation unit configured to generate an index value of a reproduced signal quality by using a distribution of the metric difference obtained by the metric difference calculation unit.

A reproducing device according to the present disclosure includes, in addition to above, a reproduction unit configured to reproduce a reproduced signal of bit information from an recording medium, and a decoding unit configured to decode binarized data by performing a PRML decoding process on the reproduced signal by partial response equalization and maximum likelihood decoding.

A signal quality evaluation method according to the present disclosure includes detecting at least one specific error pattern that is a bit pattern that is longer than a constraint length of the PRML decoding process after input of binarized data obtained by performing a PRML decoding process on a reproduced signal of bit information by partial response equalization and maximum likelihood decoding, calculating a metric difference of the at least one specific error pattern that has been detected, and generating an index value of a reproduced signal quality by using a distribution of the metric difference.

Such a technique of the present disclosure can appropriately calculate the evaluation value of the reproduced signal quality even under a high density recording condition in particular.

In conventional signal quality evaluations, the considered error patterns are only isolated errors and the length thereof are merely equivalent to or shorter than the constraint length of the maximum likelihood decoding using PRML, or the constraint length of the so-called Viterbi detection (PRML constraint length). In order to correspond to the blockwise error patterns that has become dominant in the reproduced signals of high density recording, in the present disclosure, detection of error patterns that are longer than the constraint length of the PRML decoding process is performed and the detected error patterns are used to evaluate the signals.

Advantageous Effects of Invention

The present disclosure has an advantageous effect in that, in the reproduced signal of the high density recording, an index value for signal evaluation that can have a strong correlation with the error rate, that is, that can have high accuracy, can be obtained.

Additional features and advantages are described herein, and will be apparent from the following Detailed Description and the figures.

BRIEF DESCRIPTION OF THE FIGURES

FIG. 2 illustrates explanatory diagrams of a maximum likelihood path and a second path with respect to an RF signal.

FIG. 4 illustrates explanatory diagrams of the correlation between an evaluation value and error rates.

FIG. 11 illustrates explanatory diagrams of second specific error patterns of an embodiment.

DETAILED DESCRIPTION

Hereinafter, a reproducing device of an embodiment will be described in the following order. Note that a signal quality evaluation unit 10 that is mounted on a reproducing device 1 is an example of a signal quality evaluation apparatus stipulated in the claims.

<1. Configuration of Reproduction Device>
<2. Example of Generation of Index Value Using Metric Differences>
<3. Configuration and Operation of Signal Quality Evaluation Unit>
<4. Modifications>

<1. Configuration of Reproduction Device>

Figure 1:
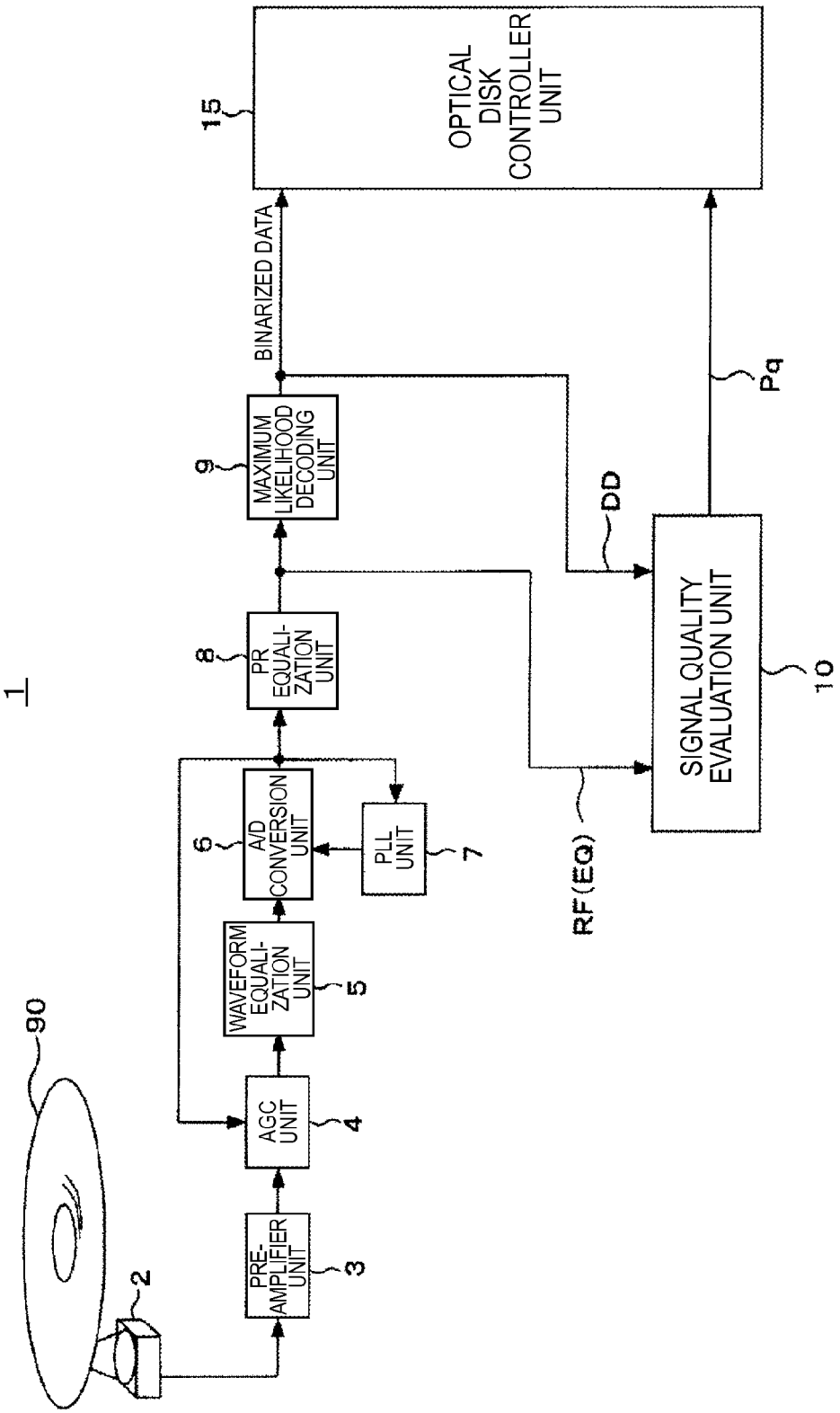
FIG. 1 is a block diagram of a reproducing device of an embodiment of the present disclosure.

FIG. 1 illustrates an exemplary configuration of the reproducing device 1 that is provided with the signal quality evaluation apparatus (the signal quality evaluation unit 10) according to the embodiment.

The reproduced signal 1 in this case is configured to reproduce a signal from an optic disk 90 serving as an example of a recording medium and to obtain an index value Pq for evaluating a quality of the reproduced signal.

The reproducing device 1 includes, for example, an optical pickup 2 that reproduces bit information of the optical disk 90, which is a removable media, and a preamplifier unit 3 that converts the signal read by the optical pickup 2 into a reproduced signal (RF signal).

Furthermore, the reproducing device 1 includes an automatic gain control (AGC) unit 4, a waveform equalization unit 5, an A/D conversion unit 6, and a phase locked loop (PLL) unit 7 that perform processing of the reproduced signal (RF signal).

Furthermore, the reproducing device 1 includes a partial response (PR) equalization unit 8 and a maximum likelihood decoding unit 9 to perform a PRML decoding process, as well as the signal quality evaluation unit 10 and an optical disk controller unit 15.

The playbacked optical disk 90 is, for example, a high-density disk that achieves a capacity of 33.4 GB that is BD equivalent or, further is, for example, a high-density disk that achieves a capacity of 40 GB that is BD equivalent. Note that BD equivalent means that a capacity of a single recording layer becomes 40 GB under a physical condition of the Blu-ray Disk. In the case of a recording line density of the bit information recorded on an optical disk, for example, the recording line density is 55.87 nm/bit for 33.4 GB and is 46.65 nm/bit for 40 GB.

In particular, the present embodiment is configured so that an index that performs appropriate reproduced signal evaluation on the reproduced signal from the recoding medium having a recording line density of 46.65 nm/bit or more can be obtained.

In the reproduced signal 1, the optical head unit 2 converges the laser beam to the recording layer of the optical disk 90 through an objective lens, receives the reflected light, and generates a reproduced signal (an RF signal) as an analog signal that indicates bit information readout from the optic disk 90.

The preamplifier unit 3 amplifies the reproduced signal at a predetermined gain and outputs the amplified signal to the AGC unit 4.

The AGC unit 4 amplifies or attenuates the amplitude of the reproduced signal from the preamplifier unit 3 on the basis of an output from the A/D conversion unit 6 and outputs the relevant signal to the waveform equalization unit 5.

The waveform equalization unit 5 has a low pass filter (LPF) property that blocks the high frequency of the reproduced signal and a high pass filter (HPF) property that blocks the low frequency of the reproduced signal and outputs the reproduced signal to the A/D conversion unit 6 after shaping the reproduced signal waveform into one with a required property.

Sampling is performed in the A/D conversion unit 6 on the reproduced signal that has been output from the waveform equalization unit 5 such that the reproduced signal is converted into digital data.

The PLL unit 7 generates a reproduction clock that synchronizes with the reproduced signal on which waveform equalization has been performed, by performing a PLL processing on the basis of an output from the A/D conversion unit 6. The sampling in the A/D conversion unit 6 is performed at the timing when the reproduction clock is generated in the PLL circuit 7. Note that although not shown, the reproduction clock is also used in the PR equalization unit 8 and the maximum likelihood decoding unit 9 for PRML decoding, as well as in the signal quality evaluation unit 10 and the optical disk controller unit 15.

PRML decoding is performed on the reproduced signal that has been converted into digitized data with the PR equalization unit 8 and the maximum likelihood decoding unit 9 such that binarized data DD, as a result of the decoding, is obtained.

The PR equalization unit 8 equalizes channel responses to target responses such as, for example, PR(1, 2, 2, 1), PR(1, 2, 2, 2, 1). In other words, suppression of high frequency noise and intentional addition of intersymbol interference are performed on the digital reproduced signal.

In particular, the present example assumes that high density recording of 40 GB or more that is BD equivalent is performed on an optic disk, for example. In such a case, the PR equalization unit 8 sets the target response to PR(1, 2, 3, 3, 3, 2, 1), for example. The constraint length of the PRML decoding process is seven.

The reproduced signal RF (EQ) to which an equalization process has been performed with the PR equalization unit 8 is supplied to the maximum likelihood decoding unit 9 as well as to the signal quality evaluation unit 10.

The maximum likelihood decoding unit 9 is constituted by a Viterbi detector, for example.

For the Viterbi detection, a Viterbi detector including a plurality of states formed with consecutive bits of a predetermined length as a unit and branches represented by transitions between the states is used, and is configured to detect a desired bit sequence efficiently from among all possible bit sequences.

An actual circuit is provided with two registers, that is, a register referred to as a path metric register for each state, for storing a path metric between a partial response sequence and a signal up to the state, and a register referred to as a path memory register, for storing a flow of a bit sequence (path memory) up to the state. The circuit is also provided with an operation unit referred to as a branch metric unit for each branch, for calculating a path metric between a partial response sequence and a signal at the bit.

The Viterbi detector can bring various bit sequences into one-to-one correspondence with individual paths passing through the above-described states. A path metric between a partial response sequence passing through these paths and an actual signal (reproduced signal) is obtained by sequentially adding together the above-mentioned branch metrics of inter-state transitions forming the paths, that is, branches.

Further, a path that minimizes the above-described path metric can be selected by comparing the magnitudes of path metrics of two branches or less reached in each state, and sequentially selecting a path with a smaller path metric. Information on this selection is transferred to the path memory register, whereby information representing a path reaching each state by a bit sequence is stored. The value of the path memory register ultimately converges to a bit sequence that minimizes the path metric while being updated sequentially, and the result is output.

The binarized data DD that is obtained as a result of the decoding by the maximum likelihood decoding unit 9 is output to the optical disk controller unit 15 and the signal quality evaluation unit 10.

The optical disk controller unit 15 demodulates the reproduction data from the optical disk 90 by performing a decoding process, an error correction process, and the like on the binarized data.

Although details will be given later, the reproduced signal RF (EQ) on which an equalization process has been performed by the PR equalization unit 8 and the binarized data DD are input to the signal quality evaluation unit 10, and the signal quality evaluation unit 10 generates an index value Pq for evaluating the reproduced signal quality and outputs the index value Pq to the optical disk controller unit 15. The optical disk controller unit 15 can evaluate the reproduced signal quality with the index value Pq.

<2. Example of Generation of Index Value using Metric Differences>

Before describing the configuration of the signal quality evaluation unit 10, a generating method of the index value Pq that uses the metric differences performed by the signal quality evaluation unit 10 will be described. Note that the method described below is merely an example that can be applied to the present embodiment and the technique of the present disclosure is not limited to the method.

As is understood, a method of bit detection by PRML is an algorithm that compares the magnitudes of a Euclidean distance between a partial response sequence obtained from a correct bit sequence and the reproduced signal (that is, a path metric for the correct bit sequence) and a Euclidean distance between a partial response sequence obtained from an erroneous bit sequence and the reproduced signal (that is, a path metric for the erroneous bit sequence), retains a closer path, that is, a path with a smaller path metric as a more likely path, and provides a path ultimately surviving after repetition of this operation (maximum likelihood path) as a result of detection.

According to such an algorithm, a large difference between the path metrics of the two closest paths (suppose that the two closest paths are a maximum likelihood path Pa and a second path Pb) with smallest path metric values as candidates selected for the ultimately surviving path indicates that the surviving path is more likely, whereas a small difference between the path metrics of the two closest paths indicates that the surviving path is more unlikely, that is, there is a stronger possibility of an detection error. This will be described with reference to FIG. 2.

FIG. 2A and FIG. 2B are diagrams illustrating the relationships among the maximum likelihood path Pa, the second path Pb, and the actually reproduced signal (the reproduced signal RF (EQ)) on which PR equalization has been performed with the PR equalization unit 8).

Note that a case of PR(1, 2, 2, 1) is illustrated to simplify the drawings and the description.

In FIGS. 2A and 2B, values "+3, +2, +1, 0, -1, -2, -3" on an axis of ordinates in the figures represent values of reference levels assumed in PR(1, 2, 2, 1).

The maximum likelihood path Pa and the second path Pb shown in the figures can be considered to be the two paths for final comparison with the reproduced signal RF. That is, a path metric value for the maximum likelihood path Pa and a path metric value for the second path Pb are compared with each other, and a path with a smaller path metric value is selected as a survivor path.

Incidentally, a path metric is a sum of Euclidean distances, that is, a sum of branch metrics between sampling values of the reproduced signal RF (EQ) which values are obtained in respective sampling timings indicated by black dots in FIG. 2 and respective values obtained in corresponding timings in the maximum likelihood path Pa (or the second path Pb).

A comparison between FIG. 2A and FIG. 2B indicates that in the case of FIG. 2A, the Euclidean distance between the maximum likelihood path Pa and the reproduced signal RF (EQ) is sufficiently close, whereas the Euclidean distance between the second path Pb and the reproduced signal RF (EQ) is sufficiently far. That is, the path metric value for the maximum likelihood path Pa is sufficiently small and the path metric value for the second path Pb is sufficiently large. It is thereby possible to determine that the maximum likelihood path Pa as a detection path in this case is a more likely path.

On the other hand, in FIG. 2B, the Euclidean distance between the maximum likelihood path Pa and the reproduced signal RF (EQ) is increased as compared with FIG. 2A, and the Euclidean distance between the second path Pb and the reproduced signal RF (EQ) is closer. That is, in this case, the path metric value for the maximum likelihood path Pa is larger than in FIG. 2A, whereas the path metric value for the second path Pb is smaller than in FIG. 2A. Therefore the likelihood of the maximum likelihood path Pa as detection path in this case is decreased. In other words, in this case, the likelihood of the second path Pb as the other path is increased, and thus the possibility of the second path Pb being the maximum likelihood path is increased. Hence, there is a stronger possibility that the detection path as the maximum likelihood path Pa is erroneously detected in place of the path shown as the second path Pb.

Thus, when the path metric value for the maximum likelihood path Pa is sufficiently smaller than the path metric value for the second path Pb, it can be determined that more likely bit detection is performed.

On the other hand, as the path metric value for the maximum likelihood path Pa becomes larger and the path metric value for the second path Pb becomes smaller, it can be determined that there is a stronger possibility of the detection path as the maximum likelihood path Pa being the wrong path.

Detection accuracy (reproduced signal quality) when the PRML method is employed can be estimated by a difference between the path metric value for the maximum likelihood path Pa and the path metric value for the second path Pb, that is, a metric difference.

In the present embodiment, such a metric difference (denoted as MD) is defined as follows.

$$MD = \sum_i (PB_i - R_i)^2 - \sum_i (PA_i - R_i)^2 \qquad [\text{Math. 1}]$$

where $PB_i$, $PA_i$, and $R_i$ represent the respective values of the second path Pb, the maximum likelihood path Pa, and the reproduced signal RF in same sampling timing.

That is, the metric difference MD in this case is defined as a value obtained by subtracting the path metric value for the maximum likelihood path Pa from the path metric value for the second path Pb.

The metric difference MD has a maximum value when the path metric value for the maximum likelihood path Pa in the right member of the above equation is zero, that is, when the maximum likelihood path Pa and the reproduced signal RF exactly coincide with each other. That is, this metric difference MD is information indicating that the larger the value of the metric difference MD, the higher the detection accuracy (that is, the better the signal quality).

FIGS. 2A and 2B described above indicate that when the maximum likelihood path Pa and the reproduced signal RF exactly coincide with each other as described above, the path metric for the second path Pb is a Euclidean distance between the maximum likelihood path Pa and the second path Pb. Hence, the maximum value of the metric difference MD as described above is the value of the Euclidean distance between the maximum likelihood path Pa and the second path Pb.

A minimum value of the metric difference MD is zero when the path metric value for the maximum likelihood path Pa and the path metric value for the second path Pb are a same value. That is, the minimum value of the metric difference MD is obtained when the reproduced signal RF is situated at an exact middle position between the maximum likelihood path Pa and the second path Pb in the case of FIGS. 2A and 2B. That is, the value of zero of the metric difference MD indicates that the maximum likelihood path and the second path are equally likely, and thus indicates a strongest possibility of an error.

Thus, the metric difference MD is information indicating higher detection accuracy as the metric difference MD becomes closer to the value of the Euclidean distance between the maximum likelihood path Pa and the second path Pb (maximum value), and conversely indicating lower detection accuracy and stronger possibility of an error as the metric difference MD becomes closer to zero (minimum value).

It is thus possible to estimate a rate of occurrence of errors in the PRML detection on the basis of the value of difference between the path metric value for the maximum likelihood path Pa and the path metric value for the second path Pb such as the metric difference MD obtained by the above Equation 1.

Generally, statistical information such for example as a variance value of values of the metric difference MD as the difference between the path metric value for the maximum likelihood path Pa and the path metric value for the second path Pb is obtained to estimate the error rate.

When the PRML method is employed, difference patterns (error patterns) between the maximum likelihood path and the second path that can actually constitute a detection error are limited to a certain extent.

Examples thereof include a one-bit error in which an edge of the bit sequence pattern of the second path is shifted by an amount corresponding to one bit with respect to the bit sequence pattern of the maximum likelihood path, and a two-bit error caused by disappearance of a 2T mark as a shortest mark.

Error patterns actually appearing as an error in an early stage of use of PRML decoding for optical disk reproduction were limited substantially 100% to one-bit errors. It was therefore possible to evaluate signal quality properly by obtaining distributions of metric differences only for the one-bit error as the only error pattern.

However, with a recent further increase in recording density of the optical disk, error patterns that can appear as an actual error have not been limited to the single pattern, and a plurality of patterns have come to contribute to errors.

Accordingly, hitherto, in a PRML class that is actually used, an index value is formed by extracting several error patterns that statistically have high frequency of error occurrence, obtaining an index value of each of the error patterns, and integrating the obtained index values together.

Since the error patterns each have a different metric difference distribution (a mean value of the distribution and a variance), the error patterns cannot be dealt as a single distribution and, thus, the above is performed.

Figure 3:
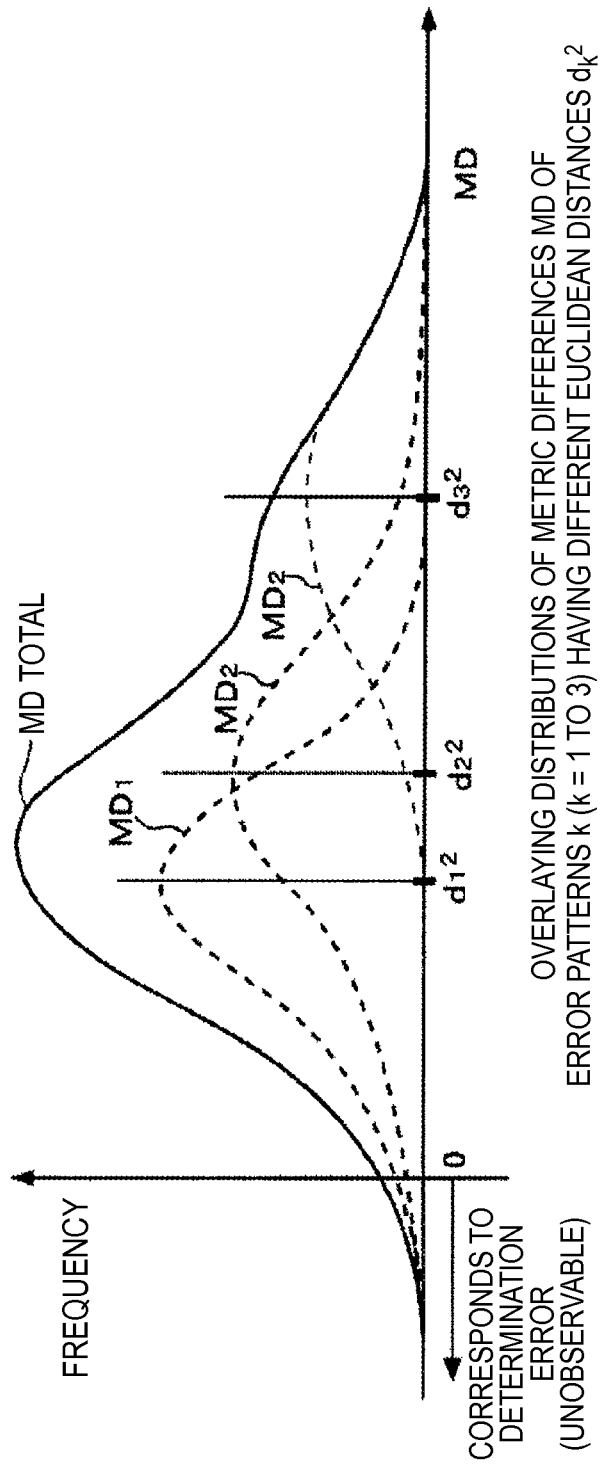
FIG. 3 is an explanatory diagram in which distributions of metric differences are overlaid with one another.

FIG. 3 shows an example of distributions of metric differences MD for error patterns having different Euclidean distances from each other. Incidentally, in this figure, an axis of ordinates indicates sample frequency, and an axis of abscissas indicates values of metric differences MD.

Suppose that in FIG. 3, three error patterns PTk (k is 1 to 3), for example, principally contribute to actual occurrence of errors, and FIG. 3 shows an example of distributions of metric differences MD for the three error patterns.

For example, a distribution denoted as MD1 in FIG. 3 is a distribution of metric differences MD for error pattern PT1 corresponding to a so-called one-bit error in which the number of different bits of the bit sequence of the maximum likelihood path Pa from those of the bit sequence of the second path Pb is one. A distribution denoted as MD2 is for example a distribution of metric differences MD for error pattern PT2 corresponding to a so-called two-bit error caused by a shift of a shortest mark or the like. A distribution denoted as MD3 is for example a distribution of metric differences MD for error pattern PT3 corresponding to a three-bit error.

Incidentally, a distribution denoted as "MD total" in FIG. 3 is represented by laying the three distributions MD1 to MD3 on top of each other.

In this case, the number of different bits of the maximum likelihood path from those of the second path differs as described above, and therefore the Euclidean distance between the maximum likelihood path Pa and the second path Pb differs in error patterns PT1 to PT3.

The Euclidean distance between the maximum likelihood path Pa and the second path Pb can be calculated by obtaining the squares of differences between values traced by the respective paths and then obtaining a sum of the squares of the differences.

Hence, in this case, letting $PA_i$ and $PB_i$ be values in the maximum likelihood path Pa and the second path Pb, respectively, in same sampling timing, the Euclidean distance $d_k^2$ in each error pattern k can be expressed by $$d_k^2 = \sum_i (PA_i - PB_i)^2 \qquad \text{[Math. 2]}$$

Under an assumption that distributions of metric differences MD are Gaussian distributions, an average value of each distribution is the value of the Euclidean distance $d_k^2$ between the maximum likelihood path Pa and the second path Pb in the error pattern k. That is, assuming that a distribution of metric differences MD is thus a Gaussian distribution, the average value of the distribution should be the value of a metric difference MD at a time of best signal quality. According to the above Equation 1 for calculating the metric difference MD, the value of the Euclidean distance between the maximum likelihood path Pa and the second path Pb is the value of the metric difference MD at the time of best signal quality.

In this case, the Euclidean distance between the maximum likelihood path Pa and the second path Pb in error pattern PT1 is represented as Euclidean distance $d_1^2$; the Euclidean distance between the maximum likelihood path Pa and the second path Pb in error pattern PT2 is represented as Euclidean distance $d_2^2$; and the Euclidean distance between the maximum likelihood path Pa and the second path Pb in error pattern PT3 is represented as Euclidean distance $d_3^2$.

At a part where the value of the metric difference MD indicated by the axis of abscissas in FIG. 3 is zero, the path metric value for the maximum likelihood path Pa is equal to the path metric value for the second path Pb, as is understood from the earlier description of the metric difference MD, and hence a detection error probability is highest.

A part where the value of the metric difference MD exceeds the part of zero (is less than zero) represents actual detection errors. This part cannot be observed in PRML. That is, while the value of the metric difference MD thus exceeding zero and becoming a negative value means that the path metric value for the second path Pb is smaller than the path metric value for the maximum likelihood path Pa, it is impossible that the value of the metric difference MD thus becomes a negative value because the PRML detection method detects a path having a minimum path metric value as the maximum likelihood path, as is understood from the description so far. Hence, this detection error part cannot be actually observed.

As described above, since PRML cannot actually observe the detection error part, the evaluation value is obtained on the basis of the below conception, for example.

FIG. 4A illustrates a distribution (MDk) of a metric difference MD of a certain error pattern PTk.

Incidentally, in this figure, as in FIG. 3, an axis of ordinates indicates sample frequency, and an axis of abscissas indicates values of metric difference MD.

As shown in FIG. 4, the present embodiment estimates an error rate by setting a predetermined value (Th_k) for values of metric difference MD, and determining the frequency (Fk) of occurrence of values of metric difference MD which values are less than the threshold value.

It is understood that the frequency (Fk) of occurrence of values of metric difference MD which values are less than the threshold value Th_k is correlated with a part where metric difference MD<0 (bit error rate bER).

Specifically, the distribution MDk when the bit error rate bER is increased with signal quality degraded, for example, has a more extended foot comparatively as shown in FIG. 4A, for example. The above occurrence frequency Fk (the area of the part FK in the figure) is correspondingly increased. That is, the occurrence frequency Fk increases as the bit error rate bER is increased.

On the other hand, when the bit error rate bER is decreased with signal quality improved as compared with FIG. 4A, the distribution MDk has a sharper shape as shown in FIG. 4B, for example. In this case, the occurrence frequency Fk is also decreased. Thus, the value of the occurrence frequency Fk decreases as the bit error rate bER is decreased.

An index value that has a strong correlation with the actual bit error rates can be obtained by setting an appropriate threshold value Th_k to each of the distributions (MD1, MD2, and MD3) of the metric differences MD of the error patterns PT1, PT2, and PT3, respectively, subject to the calculation of the index value, by detecting the occurrence frequency Fk of the values of each of the metric differences MD that is below the threshold value Th_k, and by totaling the occurrence frequencies Fk, for example.

Note that the above is an example of a conception in which the evaluation value is calculated by detecting specific error patterns and obtaining the metric differences of the distributions.

A method other than the above that uses the distributions of the metric differences of specific error patterns is disclosed in the above-described Patent Literature 4, for example.

The signal quality evaluation unit 10 of the present embodiment described hereinafter can calculate the index value Pq by use of the above methods.

<3. Configuration and Operation of Signal Quality Evaluation Unit>

Figure 5:
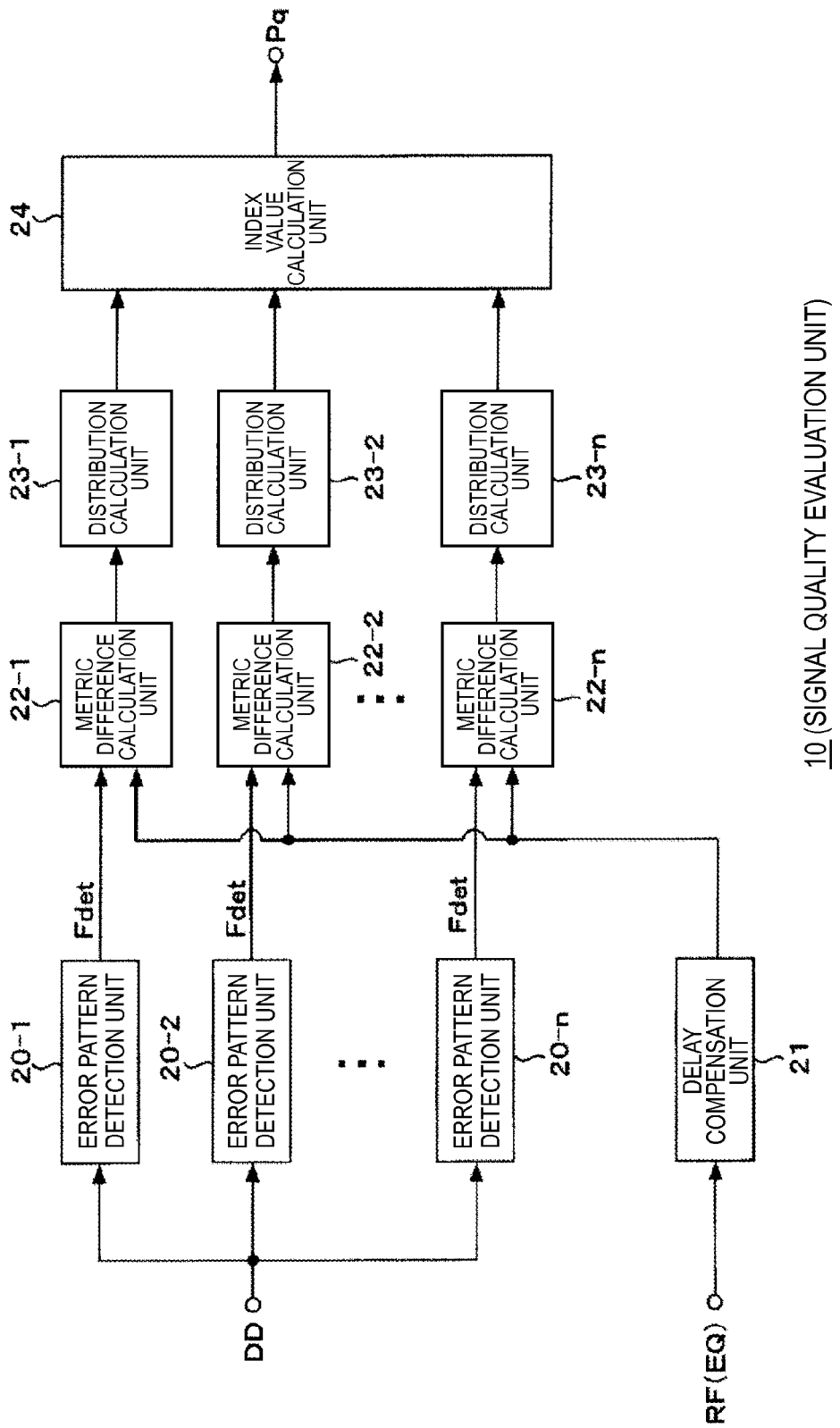
FIG. 5 is a block diagram of a signal quality evaluation unit of an embodiment.

An exemplary configuration of the signal quality evaluation unit 10 is illustrated in FIG. 5.

The signal quality evaluation unit 10 includes error pattern detection units 20 (20-1, 20-2 . . . 20-n), a delay compensation unit 21, metric difference calculation units 22 (22-1, 22-2 . . . 22-n), distribution calculation units 23 (23-1, 23-2 . . . 23-n), and an index value calculation unit 24.

Binarized data DD obtained by the PRML decoding process, which performs partial response equalization with the PR equalization unit 8 and Viterbi decoding with the maximum likelihood decoding unit 9, performed on the reproduced signal of the bit information is input to each of the error pattern detection units 20, and a single or a plurality of specific error patterns that are bit patterns longer than the constraint length are detected. Then, according to the detection, detection flags Fdet are output.

Each of the error pattern detection units 20 detects a specific error pattern. In the drawing, while n pieces of error pattern detection units 20-1, 20-2 . . . 20-n are illustrated as the error pattern detection units 20, at least one or more is to be provided.

Specific error patterns are error patterns that are considered to statistically have high error occurrence frequency in the reproduction system.

For example, as described above, in the present embodiment, PR(1, 2, 3, 3, 3, 2, 1) is set and the constraint length of the PRML decoding process performed in the PR equalization unit 8 and the maximum likelihood decoding unit 9 is seven. In such a case, the specific error patterns that are detected in the error pattern detection units 20 and that are bit patterns that are longer than the constraint length are the following error patterns PTa, PTb, and PTc.

PTa: An 8-bit pattern that becomes "10111101" when the part where bit inversion occurs is expressed as "1".

PTb: A 13-bit pattern that becomes "1011110111101" when the part where bit inversion occurs is expressed as "1".

PTc: A 14-bit pattern that becomes "10111100111101" when the part where bit inversion occurs is expressed as "1".

Note that in the above, the part where bit inversion occurs is the part where "1" and "0" in the correct pattern and the incorrect pattern are different.

Moreover, in the correct pattern and the incorrect pattern, the bit pattern is such that not only some of the "1" part is different, but all of the "1" parts are different.

As described above, error patterns that are dominant in the error occurrence frequency are selected and the distributions thereof are used when detecting the specific error patterns and obtaining an index value.

Accordingly, when the specific error pattern used as the dominant error pattern is one, then, the number of error pattern detection units 20 may be one (only the error pattern detection unit 20-1, for example). Furthermore, when there are two dominant error patterns and when the number of specific error patterns that are used to calculate the index value is two, then, two error pattern detection units 20 (the error pattern detection units 20-1 and 20-2, for example) may be provided. In this sense, "n" is the selected number of specific error patterns.

Since the metric difference calculation units 22 and the distribution calculation units 23 are each provided so as to correspond to the error pattern detection units 20, the meaning of "n" for the metric difference calculation units 22 and the distribution calculation units 23 is similar to the above.

In the present embodiment, the three error patterns PTa, PTb, and PTc described above are assumed to be the specific error patterns, for example, and in such a case, error pattern detection units 20-1, 20-2, and 20-3 are provided.

Furthermore, the error pattern detection unit 20-1 performs an operation of detecting the error pattern PTa, the error pattern detection unit 20-2 performs an operation of detecting the error pattern PTb, and the error pattern detection unit 20-3 performs an operation of detecting the error pattern PTc.

Figure 6:
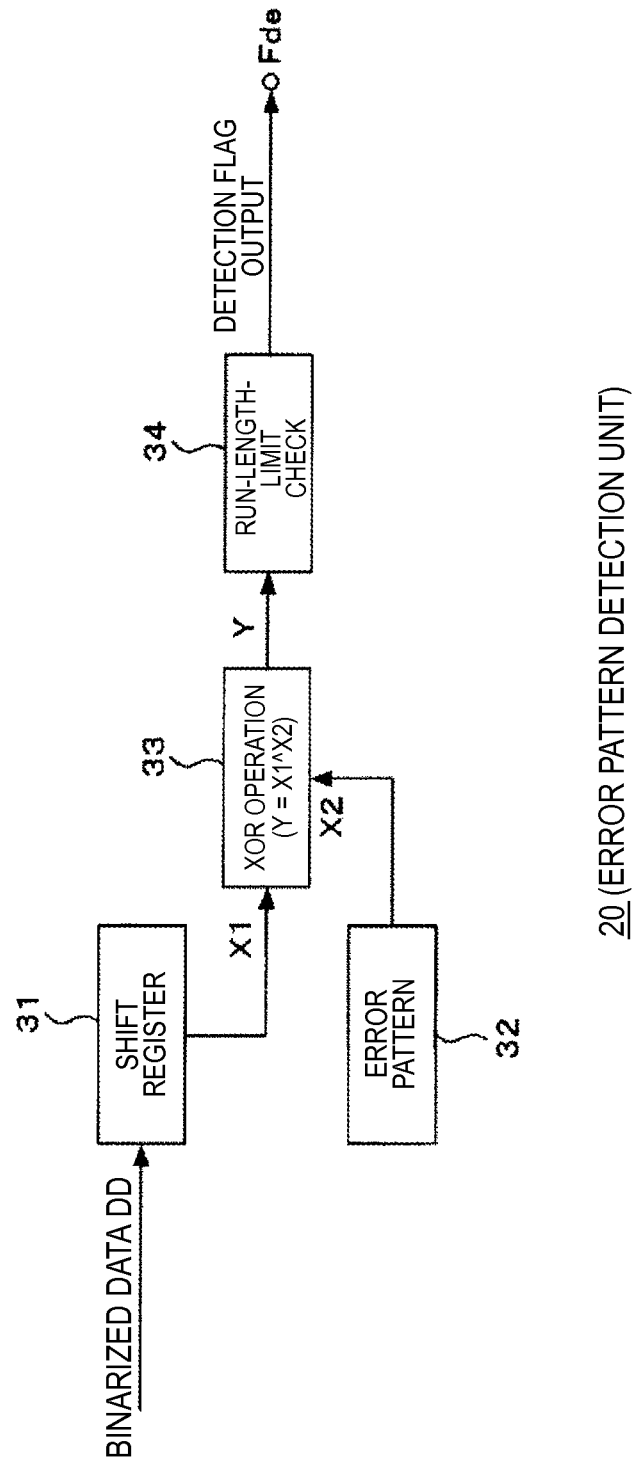
FIG. 6 is a block diagram of an error pattern detection of an embodiment.

An exemplary configuration of an error pattern detection unit 20 is illustrated in FIG. 6. A single error pattern detection unit 20 includes a shift register 31, an error pattern generation unit 32, an exclusive OR operation unit 33, and a run-length-limit check unit 34.

In the error pattern detection unit 20, first, the shift register 31 receives an input bit stream serving as binarized data DD so that data with the same clock section as that of the specific error pattern is acquired. For example, when an 8-bit specific error pattern PTa is the target of detection, data having eight clock sections is acquired. Then, the data having the clock sections is output to the exclusive OR operation unit 33 (output X1).

Furthermore, the error pattern generation unit 32 outputs a specific error pattern. For example, an 8-bit pattern of "10111101" is output to the exclusive OR operation unit 33 as the specific error pattern PTa (output X2).

In the exclusive OR operation unit 33, EXOR operation of the bit pattern (X1) from the shift register 31 and the specific error pattern (X2) is performed. In other words, bits in the bit pattern from the shift register 31 are inverted in parts where "1" exist in the "10111101" of the specific error pattern PTa. An operation result Y of the above is supplied to the run-length-limit check unit 34.

Furthermore, the run-length-limit check unit 34 examines whether the exclusive OR operation result Y satisfies the run length limitation of the modulation code.

In other words, the bit pattern consisting of 8 bits that has been supplied from the shift register 31 to the exclusive OR operation unit 33 and the bit pattern consisting of 8 bits in which bits are inverted in parts where "1" exist in the "10111101" of the specific error pattern PTa are related to each other as a maximum likelihood path and a second path that have a possibility of error occurrence corresponding to the specific error pattern PTa. Note that the above relationship is established only when the 8-bit pattern that is the result of the exclusive OR operation satisfies the run length limitation. If the run length limitation is not satisfied, the 8-bit pattern that is the result of the exclusive OR operation cannot be an erroneously detected bit sequence from the start.

Accordingly, the exclusive OR operation result satisfying the run length limitation means that an error pattern has been detected, and, in this case, a detection flag Fdet is output from the run-length-limit check unit 34.

In the above, an example of an operation of the error pattern detection unit 20-1 that detects the specific error pattern PTa, for example, has been given; however, the same applies to the configuration and the operation of the error pattern detection unit 20-2 that detects the specified error pattern PTb and the error pattern detection unit 20-3 that detects the specified error pattern PTc.

For example, in the error pattern detection unit 20-2 that detects the specified error pattern PTb, the shift register 31 supplies a binarized data DD having 13 clock sections to the exclusive OR operation unit 33. Furthermore, the error pattern generation unit 32 supplies a 13-bit pattern of "1011110111101" to the exclusive OR operation unit 33 as the specific error pattern PTb. Moreover, when the above exclusive OR operation result satisfies the run length restriction, a detection flag Fdet is output.

Referring back to FIG. 5, the reproduced signal RF (EQ) that is an output of the PR equalization unit 8 of FIG. 1 is input to the delay compensation unit 21. The delay compensation unit 21 performs delay compensation on the reproduced signal waveform to which PR equalization has been carried out while taking into account the Viterbi detection process in the maximum likelihood decoding unit 9 and the detection processes in the error pattern detection units 20, and secures synchronization between the detection flag Fdet output from the error pattern detection units 20 and the reproduced signal RF (EQ).

The metric difference calculation units 22 (22-1, 22-2 . . . 22-n) are provided so as to correspond to the error pattern detection units 20 (20-1, 20-2 . . . 20-n), respectively.

Each of the metric difference calculation units 22 is supplied with a detection flag Fdet from the corresponding error pattern detection unit 20 and the reproduced signal RF (EQ) via the delay compensation unit 21.

Moreover, in each of the metric difference calculation units 22, a metric difference associated with the reproduced signal RF (EQ) when the specific error pattern has been detected is obtained.

Note that, as can be understood from the above Math. 2, while information of the maximum likelihood path and that of the second path is needed together with information of the reproduced signal RF (EQ) in order to calculate the metric difference, each metric difference calculation unit 22 can obtain the maximum likelihood path and the second path from information of the reproduced signal RF (EQ) and that of the detection flag Fdet. For example, a detection flag Fdet of the specific error pattern PTa, the specific error pattern being the 8-clock section "10111101" detected in the error pattern detection unit 20-1, is supplied to the metric difference calculation unit 22-1. In such a case, in the reproduced signal RF (EQ) of the relevant section, the bit streams related to ones in which all of the parts that are "1" are inverted become the maximum likelihood path and the second path.

The distribution calculation units 23 (23-1, 23-2 . . . 23-n) calculate the distributions of the metric differences obtained in the metric difference calculation units 22 (22-1, 22-2 . . . 22-n), respectively. For example, the distributions described in FIGS. 3 and 4 are obtained. Accordingly, difference metric distribution that indicates the detection margin per each specific error pattern can be obtained.

The index value calculation unit 24 calculates the overall index value Pq using the distributions of the specific error patterns obtained in the distribution calculation units 23 (23-1, 23-2 . . . 23-n) and outputs the calculated index value Pq to the optical disk controller unit 15 of FIG. 1.

In other words, the distribution calculation units 23 and the index value calculation unit 24 perform processes that generate the index value Pq that generates the index value of the reproduced signal quality by using the metric difference distributions obtained in the metric difference calculation units 22. Specific processes may be ones described in FIGS. 2 and 3 or may be a process described in Patent Literature 4, for example; various examples can be considered.

The signal quality evaluation unit 10 of the present embodiment is configured as above.

In the above case, in the present example in particular, the specific error patterns PTa, PTb, and PTc described above are employed as the specific error patterns subject to detection.

The reason for the above will be given.

In the present embodiment, the optical disk 90 is assumed to be, for example, one with a recording line density of 46.65 nm/bit or more, that is, a high-density disk that achieves a capacity of 40 GB that is BD equivalent.

When such ultra-high density recording is carried out, a significant degradation in the frequency characteristic of the channel, especially in the high-frequency components, occurs and intersymbol interference of the reproduced signal becomes extremely strong; accordingly, sufficient reproduction performance cannot be obtained without newly introducing a PRML class that has a longer constraint length and that is in conformity with the frequency characteristic of the channel.

In the above case, upon change of the frequency characteristic of the reproduction channel and the PRML class, dominant error patterns also change together with the conventional conditions.

Specifically, due to a high-frequency cutoff of an optical modulation transfer function (MTF), the amplitude of a short mark reproduced signal becomes extremely low such that not only the amplitude of the reproduced signal with the shortest mark, but also the amplitude of the reproduced signal with the second shortest mark can be hardly obtained.

Figure 7:
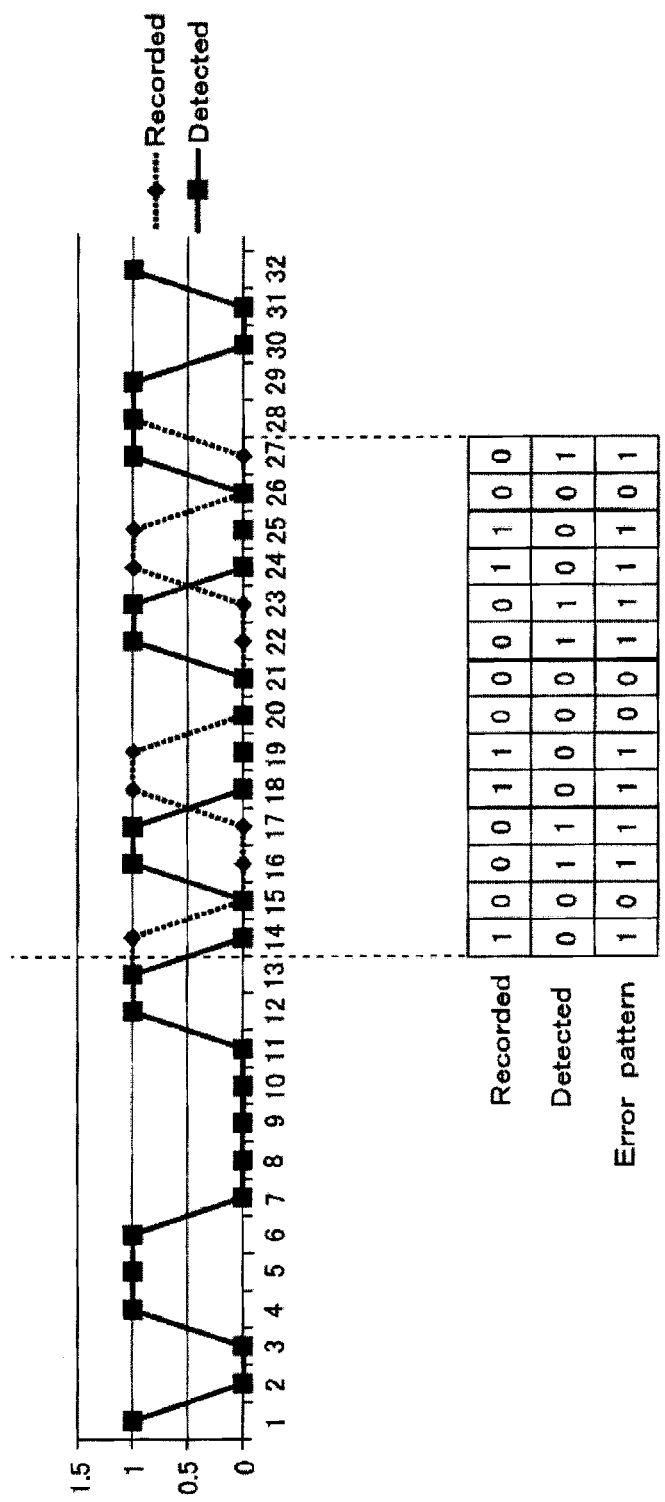
FIG. 7 is an explanatory diagram of an example of errors that occur under a high-density recording condition.

Due to the above state, while, hitherto, the error patterns of the maximum likelihood decoding using PRML was understood in units of bit or by a one-bit shift of the shortest mark (in other words, merely considering the above error patterns had been enough to express the signal quality), under an ultra-high density recording condition, as illustrated in FIG. 7, a number of new blockwise errors that include reversal of polarity of the recording mark and space have occurred. Accordingly, among the entire error rates, contribution of the above blockwise error patterns are becoming dominant.

Since the blockwise error patterns have error propagation characteristics, in some cases, an error extending across an extremely long section of 10 clock sections or more occurs.

Exemplified in FIG. 7 is an example of errors that have occurred when an optically simulated waveform from a line density that is equivalent to a BD of 40 GB has been detected by a PRML class PR(1, 2, 3, 3, 3, 2, 1)ML.

With respect to the recorded data pattern (the correct pattern) that is depicted by a broken line, an incorrect binarized data DD has actually been detected in a 14-clock section as depicted by a solid line.

The bit pattern where the errors have occurred is illustrated at the lower portion of the diagram. In this case, while the recorded bit information (in other words, the correct pattern) is "10001100001100", the detected bit information (the pattern in which the errors have occurred) is "00110000110001".

In the above case, when parts in which bit inversions have occurred between the correct pattern and the incorrect pattern are expressed by "1", "10111100111101" is obtained. In other words, the above is an example of an occurrence of errors corresponding to the specific error pattern PTc described above, and as can be understood by comparing the correct pattern and the pattern in which errors have occurred, not only phase shifts, but also errors such as reversal of polarity are accompanied.

The error patterns that have been considered during conventional signal quality evaluation have been isolated errors alone and the length thereof is shorter than the constraint length of the maximum likelihood decoding using PRML, that is, the so-called constraint length of the Viterbi detection. However, when the above-described blockwise errors become dominant, the correlation between the index value using the conventional error patterns and the reproduced signal quality becomes weak. In other words, the value of the index value becomes a value that does not appropriately express the quality of the reproduced signal.

Accordingly, the present embodiment takes into consideration the blockwise error patterns that have become dominant in the high density recording of 40 GB or more that is BD equivalent, newly performs detection of error patterns that are longer than the Viterbi constraint length, and incorporates them into the signal evaluation.

Because of the above, the above-described specific error patterns PTa, PTb, and PTc are error patterns that are employed for evaluating the signal quality as patterns that are longer than the PRML constraint length.

Figure 8:
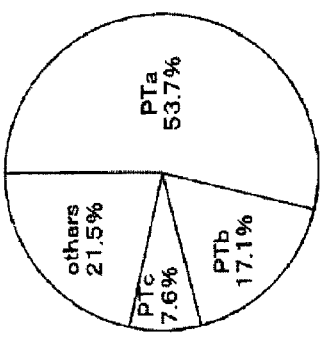
FIG. 8 illustrates explanatory diagrams of specific error patterns of an embodiment.

FIG. 8A illustrates the specific error patterns PTa, PTb, and PTc and their specific exemplary patterns.

In FIG. 8A, the lines indicated as "bit error" that are inside the thick frames correspond to the specific error patterns PTa, PTb, and PTc. In other words, they are the patterns in which the parts where bit inversions have occurred between the correct pattern and the incorrect pattern are set as "1".

The specific error pattern PTa is "10111101", and examples of the corresponding correct pattern and incorrect pattern are "10001100" and "00110001", respectively.

The specific error pattern PTb is "1011110111101", and examples of the corresponding correct pattern and incorrect pattern are "1000110001100" and "0011000110001", respectively.

The specific error pattern PTc is "10111100111101", and examples of the corresponding correct pattern and incorrect pattern are "10001100001100" and "00110000110001", respectively, that is, they are the patterns illustrated in FIG. 7.

In the present embodiment, three error pattern detection units 20-1 to 20-3 are provided as the error pattern detection units 20-1 to 20-n of FIG. 5. Furthermore, the three error pattern detection units 20-1 to 20-3 detect the bit patterns corresponding to the specific error patterns PTa, PTb, and PTc. Moreover, as described above, the index value is calculated from the distributions of the metric differences when the specific error patterns are detected.

Note that in the above case, the index value Pq is not appropriate if the specific error patterns PTa, PTb, and PTc are not actually dominant error patterns.

Now, the occurrence frequency of each of the patterns in the bit errors in the case of a recording line density of 44 GB when converted into a BD is examined, the results of which are illustrated in FIG. 8B.

That is, the specific error pattern PTa is 53.7%, the specific error pattern PTb is 17.1%, the specific error pattern PTc is 7.6%, and other patterns are 21.5%.

In other words, a dominant state of the three specific error patterns PTa, PTb, and PTc covering about 80 percent of the whole number of errors is seen. In such a case, by calculating the index value Pq on the basis of the specific error patterns PTa, PTb, and PTc, it can be said that the value has a strong correlation with the bit error rates and has high accuracy.

Figure 9:
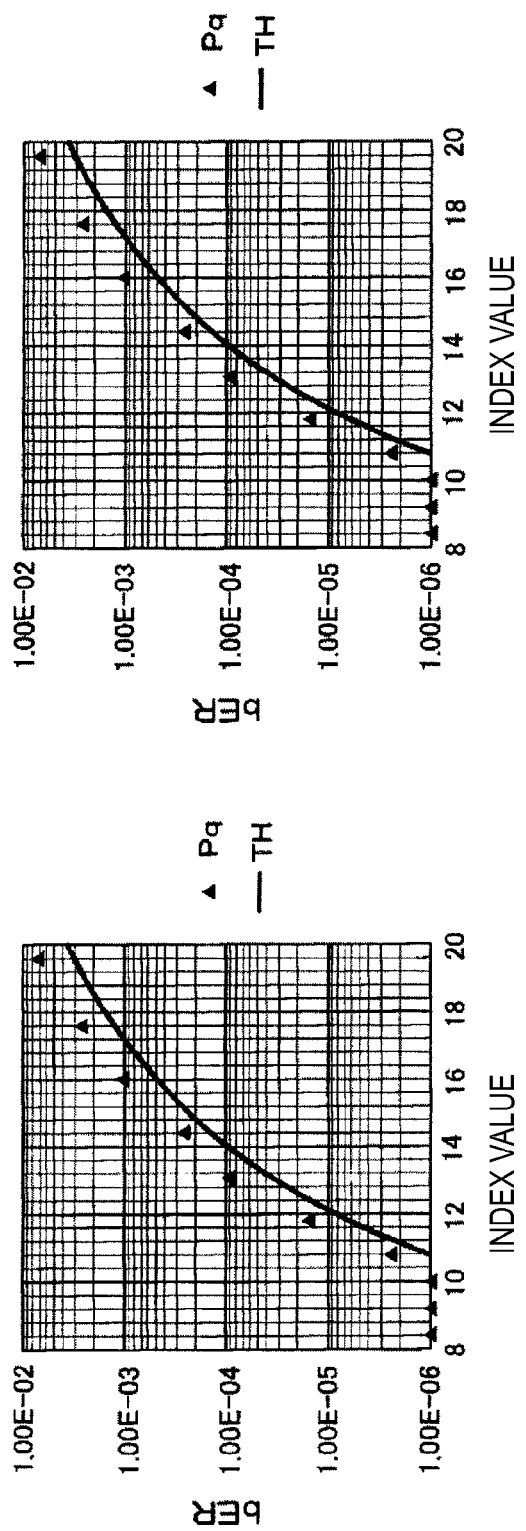
FIG. 9 illustrates explanatory diagrams of results of simulations on the correlation between the evaluation value and the bit error rate.
Figure 10:
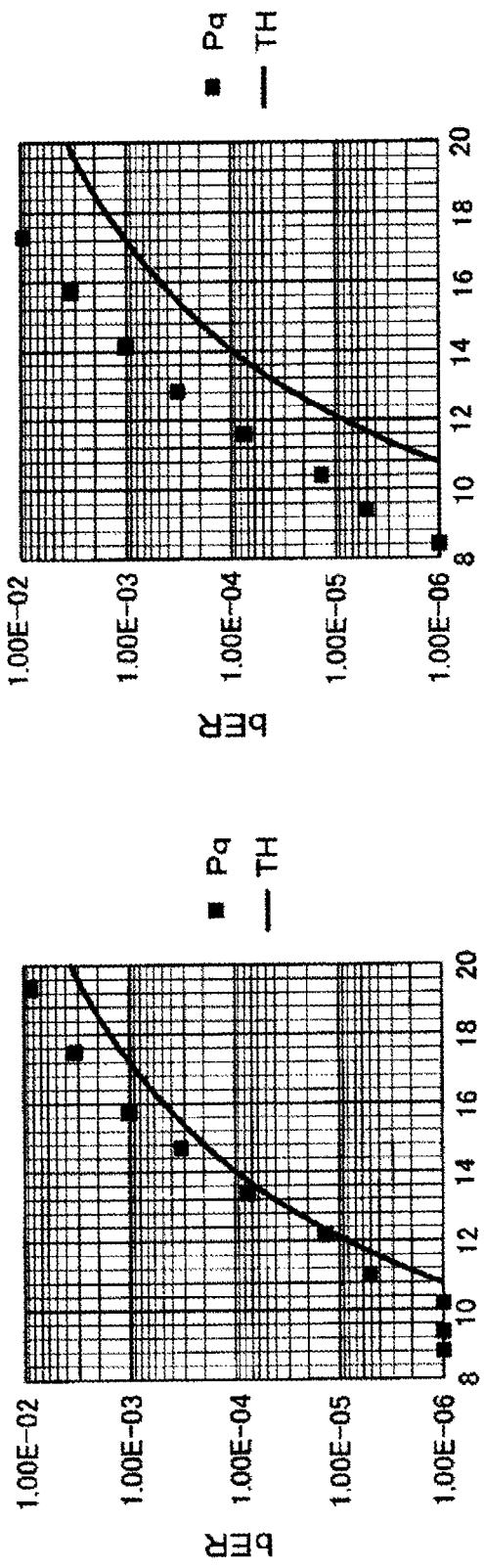
FIG. 10 illustrates explanatory diagrams of results of simulations on the correlation between the evaluation value and the bit error rate.

The results of the simulations are illustrated in FIGS. 9 and 10.

Each of FIGS. 9 and 10 illustrates the correlation between the signal quality evaluation value and the bit error rate under the optical simulation model. The axis of abscissas is the index value and the axis of ordinates is the bit error rate (bER). The calculated index values are plotted with black triangles and black squares. The solid line in the diagram indicated by TH is theoretical values of the relationship between the index value and the bit error rate when a Gaussian noise is assumed.

FIGS. 9A and 10A correspond to the embodiment in which, together with the conventional specific error patterns that is shorter than the constraint length, all of the new specific error patterns PTa, PTb, and PTc are included and in which an evaluation value is obtained for each distribution by conducting a calculation that is similar to that illustrated in Patent Literature 4, for example. FIGS. 9B and 10B are comparative examples in which the evaluation values are obtained by only the conventional specific error patterns.

Note that examples of the conventional specific error patterns are illustrated in FIG. 11. The error pattern PTd1 is a pattern that corresponds to a bit error that is an edge shift and the error pattern PTd2 is a pattern corresponding to bit errors that are consecutive 2T shifts.

FIG. 9 is a case in which a detection with PR(1, 2, 2, 2, 1)ML, which is a 5-tap PRML, is performed under a line density condition of 33 GB when converted into a BD. Under the above condition, the comparative example and the embodiment coincided well with the theoretical value and both methods can be expected to have high accuracy in the index value Pq.

In FIG. 10, a detection with PR(1, 2, 3, 3, 3, 2, 1)ML, which is a 7-tap PRML, is performed under a ultra-high line density condition of 40 GB when converted into a BD, the condition greatly exceeding the conventional optical disk. Under the above condition, in the result of the comparative example of FIG. 10B, the index value Pq is widely separated from the theoretical value and it is estimated that, due to various signal degradation factors under a real machine condition, the correlation between the index value and the error rate may vary resulting in significant degradation in the accuracy of the index.

Meanwhile, in the embodiment of FIG. 10A, even under the above line density condition, the index value Pq coincided with the theoretical value in a similar manner to when under the conventional optical disk condition, thus, high accuracy (correlation with the error rate) can be expected even under a real machine condition.

As described above, detection is performed with PR(1, 2, 3, 3, 3, 2, 1)ML and the constraint length during the PRML decoding process performed in the PR equalization unit 8 and the maximum likelihood decoding unit 9 is seven. In such a case, for example, the error pattern detection units 20 perform detection of specific error patterns PT1 "10111101", PT2 "1011110111101", and PT3 "10111100111101" ("1" in each pattern indicates a part where a bit inversion has occurred). Furthermore, metric differences of the specific error patterns are calculated and an index value Pq of the reproduced signal quality is generated using the distributions of the metric differences. Accordingly, an index value serving as a signal quality evaluation value with high accuracy can be obtained.

<4. Modifications>

While a description of an embodiment has been given above, various modifications of the embodiment can be conceived.

First, as for the specific error patterns subject to detection, not all of the above-described specific error patterns PTa, PTb, and PTc need to be used.

Furthermore, when specific error patterns (PTa, PTb, PTc, and the like) that are bit patterns that are longer than the PRML constraint length are referred to as first specific error patterns, second specific error patterns (PTd1, PTd2, and the like in FIG. 11, for example) that are bit patterns that are shorter than the PRML constraint length may be used in combination.

Accordingly, the following exemplary configuration may be considered as a specific example of the signal quality evaluation unit 10. Note that an "arithmetic processing system" referred to hereinafter denotes a processing system of the error pattern detection units 20, the metric difference calculation units, and the distribution calculation units 23, that is, the arithmetic processing system denotes a processing system corresponding to a single specific error pattern. FIG. 5 of the embodiment described above depicts that there are n numbers of arithmetic processing systems; the following are the specific examples thereof.

EXAMPLE 1

An exemplary configuration in which a single arithmetic processing system is provided (n=1) and the index value Pq is calculated using the specific error pattern PTa.

EXAMPLE 2

An exemplary configuration in which a single arithmetic processing system is provided (n=1) and the index value Pq is calculated using the specific error pattern PTb.

EXAMPLE 3

An exemplary configuration in which a single arithmetic processing system is provided (n=1) and the index value Pq is calculated using the specific error pattern PTc.

EXAMPLE 4

An exemplary configuration in which two arithmetic processing systems are provided (n=2) and the index value Pq is calculated using the specific error patterns PTa and PTb.

EXAMPLE 5

An exemplary configuration in which two arithmetic processing systems are provided (n=2) and the index value Pq is calculated using the specific error patterns PTa and PTb.

EXAMPLE 6

An exemplary configuration in which two arithmetic processing systems are provided (n=2) and the index value Pq is calculated using the specific error patterns PTb and PTc.

EXAMPLE 7

An exemplary configuration in which three arithmetic processing systems are provided (n=3) and the index value Pq is calculated using the specific error patterns PTa, PTb and PTc.

EXAMPLE 8

An exemplary configuration in which two or more arithmetic processing systems are provided (n is greater than or equal to 2) and the index value Pq is calculated using one of the first specific error patterns (either one of PTa, PTb, and PTc, for example) and a single or a plurality of second specific error patterns.

EXAMPLE 9

An exemplary configuration in which three or more arithmetic processing systems are provided (n is greater than or equal to 3) and the index value Pq is calculated using two specific error patterns serving as the first specific error patterns and a single or a plurality of second specific error patterns.

EXAMPLE 10

An exemplary configuration in which four or more arithmetic processing systems are provided (n is greater than or equal to 4) and the index value Pq is calculated using three specific error patterns serving as the first specific error patterns and a single or a plurality of second specific error patterns.

In either examples 1 to 10, by using at least one first specific error pattern (either one or a plurality of PTa, PTb, and PTc, for example), the index value Pq that has a strong correlation with the bit error rate, especially in a high-density recoding equivalent to a BD of 40 GB, can be calculated.

Furthermore, in the present example, a PR(1, 2, 3, 3, 3, 2, 1)ML detection is given as an example; however, the configuration of the reproducing device is not limited to the above.

For example, in a case of a PR class that is effective (that is, that can sufficiently reduce errors and that can be put to practical use) in the case of a recording line density of 40 GB that is BD equivalent, the specific error patterns PTa, PTb, and PTc are dominant patterns; accordingly, even when other PR classes are employed, the technique of the present disclosure is effective.

Furthermore, patterns other than the above-described specific error patterns PT1, PT2, and PT3 can be considered as specific error patterns that are longer than the constraint length. Specific error patterns with long sections (sections exceeding the constraint length) that correspond to block-wise errors may be selected in accordance with the PR class selected in accordance with the high density recording and the frequency characteristic.

Furthermore, the technique of the present disclosure can be widely applied to decoding of bit information reproduced from a recording medium and decoding of bit information that has been transmitted. The recording medium is not limited to an optical disk and any recoding medium is assumed.

Additionally, the present technology may also be configured as below.

(1)

A signal quality evaluation apparatus, including:
an error pattern detection unit to which binarized data obtained by performing a PRML decoding process on a reproduced signal of bit information by partial response equalization and maximum likelihood decoding is input, the error pattern detection unit configured to detect at least one specific error pattern that is a bit pattern that is longer than a constraint length of the PRML decoding process;
a metric difference calculation unit configured to calculate a metric difference of the at least one specific error pattern that has been detected by the error pattern detection unit; and
an index value generation unit configured to generate an index value of a reproduced signal quality by using a distribution of the metric difference obtained by the metric difference calculation unit.

(2)

The signal quality evaluation apparatus according to (1), wherein
when the constraint length is 7, at least one of the at least one specific error pattern is an 8-bit pattern of "10111101" when a part where bit inversion occurs is expressed by "1".

(3)

The signal quality evaluation apparatus according to (1) or (2), wherein when the constraint length is 7, at least one of the at least one specific error pattern is a 13-bit pattern of "1011110111101" when a part where bit inversion occurs is expressed by "1".

(4)

The signal quality evaluation apparatus according to any one of (1) to (3), wherein when the constraint length is 7, at least one of the at least one specific error pattern is a 14-bit pattern of "10111100111101" when a part where bit inversion occurs is expressed by "1".

(5)

The signal quality evaluation apparatus according to any one of (1) to (4), wherein
when the at least one specific error pattern that is the bit pattern that is longer than the constraint length is a first specific error pattern,
the error pattern detection unit performs, in addition to the first specific error pattern, detection of at least one second specific error pattern that is a bit pattern that is shorter than the constraint length, and
the metric difference calculation unit calculates a metric difference of each of the at least one first specific error pattern and the at least one second specific error pattern that have been detected by the error pattern detection unit.

(6)

The signal quality evaluation apparatus according to any one of (1) to (5), wherein
the reproduced signal of the bit information is a signal that has been reproduced from a recording medium on which bit information has been recorded at a recording line density of 44.65 nm/bit or higher.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 1 reproducing device
8 PR equalization unit
9 maximum likelihood decoding unit
10 signal quality evaluation unit
20 (20-1 . . . 20-n) error pattern detection unit
21 delay compensation unit
22 (22-1 . . . 22-n) metric difference calculation unit
23 (23-1 . . . 23-n) distribution calculation unit
24 index value calculation unit

The invention claimed is:

1. A signal quality evaluation apparatus, comprising:
an error pattern detection unit to which binarized data is input, the error pattern detection unit configured to detect at least one specific error pattern that is a bit pattern that is longer than a constraint length of the PRML decoding process;
a metric difference calculation unit configured to calculate a metric difference of the at least one specific error pattern that has been detected by the error pattern detection unit; and
an index value generation unit configured to generate an index value of a reproduced signal quality by using a distribution of the metric difference obtained by the metric difference calculation unit,
wherein the binarized data is decoded by a PRML decoding process on a reproduced signal of bit information including partial response equalization and maximum likelihood decoding.

2. The signal quality evaluation apparatus according to claim 1, wherein when the constraint length is 7, at least one of the at least one specific error pattern is an 8-bit pattern of "10111101" when a part where bit inversion occurs is expressed by "1".

3. The signal quality evaluation apparatus according to claim 1, wherein
when the constraint length is 7, at least one of the at least one specific error pattern is a 13-bit pattern of "1011110111101" when a part where bit inversion occurs is expressed by "1".

4. The signal quality evaluation apparatus according to claim 1, wherein
when the constraint length is 7, at least one of the at least one specific error pattern is a 14-bit pattern of "10111100111101" when a part where bit inversion occurs is expressed by "1".

5. The signal quality evaluation apparatus according to claim 1, wherein
when the at least one specific error pattern that is the bit pattern that is longer than the constraint length is a first specific error pattern,
the error pattern detection unit performs, in addition to the first specific error pattern, detection of at least one second specific error pattern that is a bit pattern that is shorter than the constraint length, and
the metric difference calculation unit calculates a metric difference of each of the at least one first specific error pattern and the at least one second specific error pattern that have been detected by the error pattern detection unit.

6. The signal quality evaluation apparatus according to claim 1, wherein
the reproduced signal of the bit information is a signal that has been reproduced from a recording medium on which bit information has been recorded at a recording line density of 44.65 nm/bit or higher.

7. A signal quality evaluation method, comprising:
detecting, by an error pattern detection unit, at least one specific error pattern that is a bit pattern that is longer than a constraint length of the PRML decoding process after input of binarized data obtained by performing a PRML decoding process on a reproduced signal of bit information by partial response equalization and maximum likelihood decoding;
calculating, by a metric difference calculation unit, a metric difference of the at least one specific error pattern that has been detected; and
generating, by an index value generation unit, an index value of a reproduced signal quality by using a distribution of the metric difference.

8. A reproducing device, comprising:
a reproduction unit configured to reproduce a reproduced signal of bit information from an recording medium;
a decoding unit configured to decode binarized data by performing a PRML decoding process on the reproduced signal by partial response equalization and maximum likelihood decoding;
an error pattern detection unit to which the binarized data is input, the error pattern detection unit configured to detect at least one specific error pattern that is a bit pattern that is longer than a constraint length of the PRML decoding process;
a metric difference calculation unit configured to calculate a metric difference of the at least one specific error pattern that has been detected by the error pattern detection unit; and
an index value generation unit configured to generate an index value of a reproduced signal quality by using a distribution of the metric difference obtained by the metric difference calculation unit.

9. The reproducing device according to claim 8, wherein
when the constraint length is 7, at least one of the at least one specific error pattern is an 8-bit pattern of "10111101" when a part where bit inversion occurs is expressed by "1".

10. The reproducing device according to claim 8, wherein
when the constraint length is 7, at least one of the at least one specific error pattern is a 13-bit pattern of "1011110111101" when a part where bit inversion occurs is expressed by "1".

11. The reproducing device according to claim 8, wherein
when the constraint length is 7, at least one of the at least one specific error pattern is a 14-bit pattern of "10111100111101" when a part where bit inversion occurs is expressed by "1".

12. The reproducing device according to claim 8, wherein
when the at least one specific error pattern that is the bit pattern that is longer than the constraint length is a first specific error pattern,
the error pattern detection unit performs, in addition to the first specific error pattern, detection of at least one second specific error pattern that is a bit pattern that is shorter than the constraint length, and
the metric difference calculation unit calculates a metric difference of each of the at least one first specific error pattern and the at least one second specific error pattern that have been detected by the error pattern detection unit.

13. The reproducing device according to claim 8, wherein
the reproduced signal of the bit information is a signal that has been reproduced from a recording medium on which bit information has been recorded at a recording line density of 44.65 nm/bit or higher.

* * * * *